United States Patent
Li et al.

(10) Patent No.: US 11,066,310 B2
(45) Date of Patent: Jul. 20, 2021

(54) TUNGSTEN PENTACHLORIDE CONDITIONING AND CRYSTALLINE PHASE MANIPULATION

(71) Applicant: L'Air Liquide, Société Anonyme pour l'Etude et l'Exploitation des Procédés Georges Claude, Paris (FR)

(72) Inventors: Feng Li, San Jose, CA (US); Sonia Plaza, Fremont, CA (US); Jean-Marc Girard, Versailles (FR); Nicolas Blasco, Grenoble (FR); Yumin Liu, San Jose, CA (US)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 16/897,915

(22) Filed: Jun. 10, 2020

(65) Prior Publication Data
US 2020/0299147 A1 Sep. 24, 2020

Related U.S. Application Data

(62) Division of application No. 15/966,924, filed on Apr. 30, 2018, now Pat. No. 10,710,896.

(51) Int. Cl.
*C01G 41/04* (2006.01)
*C30B 35/00* (2006.01)
*C30B 33/02* (2006.01)

(52) U.S. Cl.
CPC .............. *C01G 41/04* (2013.01); *C30B 33/02* (2013.01); *C30B 35/002* (2013.01); *C01P 2002/70* (2013.01)

(58) Field of Classification Search
CPC ............................ C01G 41/04; C01P 2002/70
See application file for complete search history.

(56) References Cited

U.S. PATENT DOCUMENTS

| 7,141,095 B2 | 11/2006 | Aitchison et al. |
| 7,641,886 B2 | 1/2010 | Tenne et al. |
| 9,219,009 B2 | 12/2015 | Lai et al. |
| 9,230,815 B2 | 1/2016 | Fu et al. |
| 9,595,470 B2 | 3/2017 | Bamnolker et al. |
| 9,601,339 B2 | 3/2017 | Fu et al. |
| 2003/0190424 A1 | 10/2003 | Sneh |
| 2009/0181168 A1 | 7/2009 | Chaubey et al. |
| 2016/0305020 A1 | 10/2016 | Wu et al. |

(Continued)

FOREIGN PATENT DOCUMENTS

| JP | 2017 239342 | 12/2017 |
| JP | 2019 7073 | 1/2019 |
| KR | 10 2016 0124032 | 10/2016 |
| WO | WO 2017 075172 | 5/2017 |

(Continued)

OTHER PUBLICATIONS

Cotton, F.A. et al., "Tungsten pentacholoride," Acta Cryst. (1978) B34, 2833-2834.

(Continued)

*Primary Examiner* — Ngoc-Yen Nguyen
(74) *Attorney, Agent, or Firm* — Allen E. White; Patricia E. McQueeney

(57) ABSTRACT

Conditioning of tungsten pentachloride to form specific crystalline phases is disclosed. The specific crystalline phases permit stable vapor pressures over extended periods of time during vapor deposition and etching processes.

4 Claims, 5 Drawing Sheets

(56) References Cited

U.S. PATENT DOCUMENTS

| | | |
|---|---|---|
| 2017/0335450 A1 | 11/2017 | Collins et al. |
| 2017/0350013 A1 | 12/2017 | Chan et al. |
| 2019/0023582 A1 | 1/2019 | Li et al. |
| 2019/0233301 A1* | 8/2019 | Takahashi ............ C01G 23/022 |

FOREIGN PATENT DOCUMENTS

| | | |
|---|---|---|
| WO | WO 2017 130745 | 8/2017 |
| WO | WO 2019 115361 | 6/2019 |

OTHER PUBLICATIONS

Drobot, D.V. et al., "Equilibrium diagram of the WC4-WC16 system," Russian Journal of Inorganic Chemistry 22 (8) 1977, 1217-1218.

Drobot, D.V. et al., "Phase equilibria in the tungsten-chlorine-oxygen system," Russian Journal of Inorganic Chemistry, 22 (7) 1977, 1062-1064.

Enghag, P. et al., "Thermodynamic properties of $WOCl_4$," Acta Chemica Scandivanica 26 (1972), 1067-1072.

Okamoto, H., "Cl-W," Journal of Phase Equilibria and Diffusion, vol. 31, No. 4 (2010), 402-403.

Plante, E.R. et al., Vapor pressure and heat of sublimation of tungsten, Journal of Research of the National Bureau of Standards, Section A, Physics and Chemistry, 1973, vol. 77A, No. 2, Mar.-Apr. 1973, 237-242.

International Search Report and Written Opinion for corresponding PCT/US2019/029969, dated Aug. 14, 2019.

International Search Report and Written Opinion for related PCT/US2019/029970, dated Aug. 8, 2019.

\* cited by examiner

TUNGSTEN PENTACHLORIDE CONDITIONING AND CRYSTALLINE PHASE MANIPULATION

CROSS REFERENCE TO RELATED APPLICATIONS

This application is a divisional of U.S. patent application Ser. No. 15/966,924, filed Apr. 30, 2018, the entire contents of which are incorporated herein by reference.

TECHNICAL FIELD

Conditioning of tungsten pentachloride to form specific crystalline phases is disclosed. The specific crystalline phases permit stable vapor pressures over extended periods of time during vapor deposition and etching processes.

BACKGROUND $WCl_5$ has attracted interest as CVD or ALD materials used to deposit W-containing films, such as W metal; $WSi_2$; $WX_2$, in which X is S, Se, or Te; W-doped amorphous Carbon, $WO_3$, etc. (see, e.g., U.S. Pat. Nos. 9,595,470; 9,230,815, and 7,641,886 and US Pat App Pub Nos 2003/190424 and 2017/350013).

The crystal structure of $WCl_5$ has been reported in Acta Crystallogr. (1978) B34, pp.2833-2834. Its powder X-ray diffraction pattern was collected as International Centre for Diffraction Data Powder Diffraction File (PDF) card #04-005-4302. Okamoto reported the W—Cl phase diagram. Journal of Phase Equilibria and Diffusion, Vol. 31, No. 4 (2010).

WO2017/130745 to JX Nippon Mining & Metals Corp discloses a high purity tungsten pentachloride synthesis method.

WO2017/075172 to L'Air Liquide, Societe Anyonyme pour l'Etude et l'Exploitation des Procedes Georges Claude discloses a vessel having internally wettable surface therein coated with one or more barrier layers to, for example, inhibit contamination of a material, such as a metal halide, contained in the vessel.

$WCl_5$ suffers from being a solid, low vapor pressure precursor. Providing a sufficient flux to the processing chamber from a solid, low pressure precursor like $WCl_5$ is difficult. Another challenge is to maintain a stable flux of precursor as the $WCl_5$ containing package is being depleted. Both aspects are common to all solids, and may be addressed by using solid-specific packaging (see, e.g., US Pat App Pub Nos 2009/0181168 and 2017/0335450).

A need remains to supply a stable and reproducible flux of $WCl_5$ vapors to a vapor deposition or etching process chamber over extended periods of time.

SUMMARY

Disclosed are methods of conditioning $WCl_5$ to produce a $WCl_5$-containing compositions comprising approximately 10% weight to approximately 40% weight of phase 1 $WCl_5$ as determined by X-ray diffraction. A container of $WCl_5$ is heated to a temperature ranging from approximately 190° C. to 245° C. for a time period ranging from approximately 2 hours to approximately 48 hours. The disclosed methods may include one or more of the following aspects:
- the container being selected to be non-reactive to $WCl_5$;
- the container being glass;
- the container being a glass-coated container;
- the container designed to prevent direct contact between $WCl_5$ and stainless steel;
- the time period ranging from approximately 24 hours to approximately 48 hours;
- the time period ranging from approximately 40 hours to approximately 48 hours;
- the temperature ranging from approximately 205° C. to 240° C.;
- the temperature ranging from approximately 215° C. to 235° C.;
- the $WCl_5$-containing composition comprising approximately 10% weight to approximately 35% weight of Phase 1 $WCl_5$;
- the $WCl_5$-containing composition comprising approximately 10% weight to approximately 30% weight of Phase 1 $WCl_5$;
- the $WCl_5$-containing composition comprising approximately 10% weight to approximately 25% weight of Phase 1 $WCl_5$;

Also disclosed are the $WCl_5$-containing compositions conditioned by the methods disclosed above. The $WCl_5$-containing compositions have approximately 10% weight to approximately 40% weight of Phase 1 $WCl_5$ as determined by X-ray diffraction. The disclosed $WCl_5$-containing compositions may contain one or more of the following aspects:
- the $WCl_5$-containing material having approximately 10% weight to approximately 35% weight of Phase 1 $WCl_5$;
- the $WCl_5$-containing material having approximately 10% weight to approximately 30% weight of Phase 1 $WCl_5$;
- the $WCl_5$-containing material having approximately 10% weight to approximately 25% weight of Phase 1 $WCl_5$.

Also disclosed are methods of providing a stable vapor pressure of $WCl_5$ over a time period by subliming a $WCl_5$-containing composition comprising approximately 10% weight to approximately 40% weight of Phase 1 $WCl_5$ as determined by X-ray diffraction. The $WCl_5$-containing compositions conditioned by the methods disclosed above is introduced into a solid precursor vaporizer. The solid precursor vaporizer is connected to the semiconductor processing chamber and heated to a temperature for the time period to deliver a steady supply of $WCl_5$ vapor. The disclosed methods may include one or more of the following aspects:
- the container being selected to be non-reactive to $WCl_5$;
- the container being glass;
- the container being a glass-coated container;
- the container designed to prevent direct contact between $WCl_5$ and stainless steel;
- the temperature ranging from approximately 100° C. to 150° C.; the time period ranging from approximately 60 minutes to approximately 16 hours;
- the time period ranging from approximately 24 hours to approximately 48 hours;
- the time period ranging from approximately 40 hours to approximately 48 hours;
- the $WCl_5$-containing composition comprising approximately 10% weight to approximately 35% weight of Phase 1 $WCl_5$;
- the $WCl_5$-containing composition comprising approximately 10% weight to approximately 30% weight of Phase 1 $WCl_5$;
- the $WCl_5$-containing composition comprising approximately 10% weight to approximately 25% weight of Phase 1 $WCl_5$.

Notation and Nomenclature

Certain abbreviations, symbols, and terms are used throughout the following description and claims, and include:

As used herein, the indefinite article "a" or "an" means one or more.

As used herein, the terms "approximately" or "about" mean±10% of the value stated.

As used herein, the term "comprising" is inclusive or open-ended and does not exclude additional, unrecited materials or method steps; the term "consisting essentially of" limits the scope of a claim to the specified materials or steps and additional materials or steps that do not materially affect the basic and novel characteristics of the claimed invention; and the term "consisting of" excludes any additional materials or method steps not specified in the claim.

As used herein, the abbreviation "RT" means room temperature or a temperature ranging from approximately 18° C. to approximately 25° C.

As used herein, the abbreviation "XRD" means X-Ray Diffraction and "PXRD" means Powder X-Ray Diffraction.

As used herein, the abbreviation "ALD" means Atomic Layer Deposition and the abbreviation "CVD" means Chemical Vapor Deposition.

As used herein, any reference to $WX_5$ includes the monomeric $WX_5$, the dimeric $W_2X_{10}$, and combinations thereof.

The standard abbreviations of the elements from the periodic table of elements are used herein. It should be understood that elements may be referred to by these abbreviations (e.g., W refers to tungsten, Si refers to silicon, C refers to carbon, etc.).

Any and all ranges recited herein are inclusive of their endpoints (i.e., x=1 to 4 or x ranges from 1 to 4 includes x=1, x=4, and x=any number in between), irrespective of whether the term "inclusively" is used.

BRIEF DESCRIPTION OF THE FIGURES

For a further understanding of the nature and objects of the present invention, reference should be made to the following detailed description, taken in conjunction with the accompanying FIGS.

DESCRIPTION OF PREFERRED EMBODIMENTS

Applicants have discovered that the sublimation rate from $WCl_5$ subject to normal industrial sublimation conditions gradually decreases, leading to performance drift in processes that utilize $WCl_5$ vapors. In other words, the process rate (i.e., deposition or etching rate) using a new canister is faster than the process rate after a portion of the same canister has been used.

Further analysis demonstrates that the change in performance is due to the change in the relative fraction of the crystalline phases of $WCl_5$. More particularly, as shown in Example 1, the crystalline phase of freshly sublimed $WCl_5$ tends to comprise greater than 95% of one $WCl_5$ crystalline phase ("Phase 1"). However, during the vapor deposition and/or etching process, the canister of $WCl_5$ is heated to a temperature of approximately 150° C. (see, e.g., Example 3 of PCT Pat App Pub WO2017/075172). As shown in Example 3 of the present application, the percentage of Phase 1 $WCl_5$ drops to approximately 35% after 120 days at 120° C.

Figure 1:
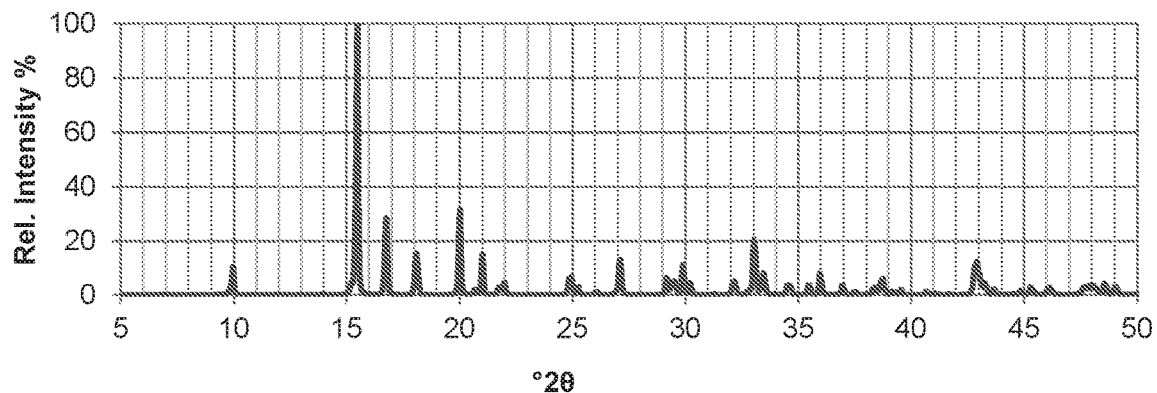
FIG. 1 is an X-Ray Diffraction (XRD) graph of % relative intensity versus the °2θ position of Phase 1 $WCl_5$ (copper radiation)

To Applicant's knowledge, the crystal structure of Phase 1 has not been reported. Phase 1 of $WCl_5$ is monoclinic with space group 12 as C2/m. The unit cell parameters are a=18.11 Å, b=17.72 Å, c=5.809 Å, and β=90.35°. Phase 1 of $WCl_5$ is isostructural to reported compounds $NbCl_5$ (PXRD pattern: ICDD PDF Card #04-0005-4229, for structure see Ref Acta Crystallogr. 1958, 11, pp. 615-619) and $TaCl_5$ (PXRD pattern: ICDD PDF Card #04-109-4194, for structure see Ref Anorg Allg Chem., 2001, 627, pp. 180-185). The crystal structure for Phase 1 may be generated by modifying the unit cell parameters of $NbCl_5$ or $TaCl_5$ with the above unit cell parameters obtained from PXRD data. The corresponding Nb or Ta atoms are then replaced with W atoms. The simulated PXRD data may be generated using software such as Mercury or CrystDiffract software. FIG. 1 is the simulated PXRD spectrum of Phase 1 generated using the Mercury software.

Figure 2:
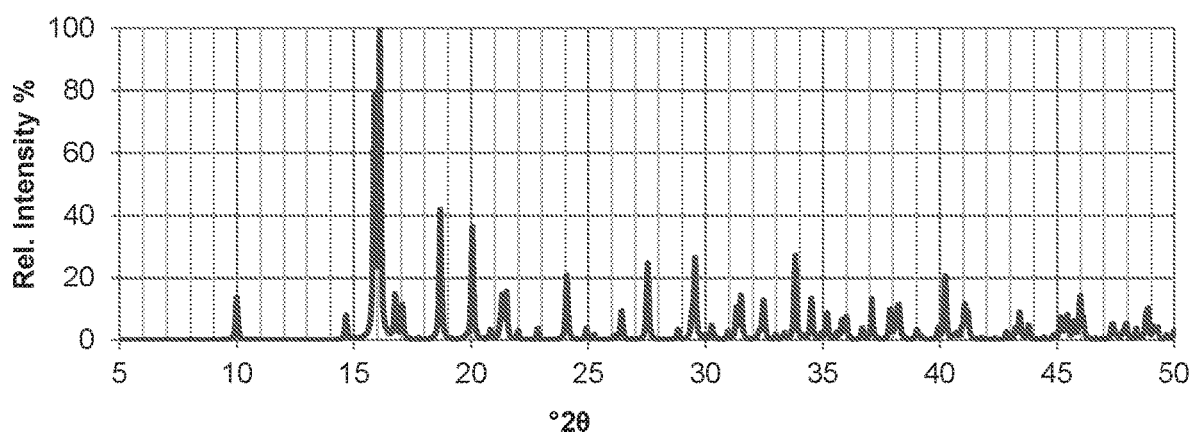
FIG. 2 is an XRD graph of % relative intensity versus the °2θ position of Phase 2 $WCl_5$ (copper radiation)

The PXRD pattern and crystal structure of Phase 2 of $WCl_5$ have been previously reported at ICDD PDF Card #04-005-4302 and Acta Crystallogr. 1978, B34, pp. 2833-2834. Similar to Phase 1, Phase 2 is monoclinic with space group 12 as C2/m. The unit cell parameters are a=17.438(4) Å, b=17.706 Å, c=6.063(1) Å, β=95.51(2)°. FIG. 2 is the simulated PXRD spectrum of Phase 2 from its crystal structure. The simulated PXRD pattern of FIG. 2 is identical to the one deposited in the ICDD database.

TABLE 1

X Ray Diffraction Simulation Data for Phase 1 and Phase 2 $WCl_5$

| Phase 1 | | Phase 2 | |
|---|---|---|---|
| 2 Theta (°) | Relative Intensity % | 2 Theta (°) | Relative Intensity % |
| 9.956 | 10.61 | 9.983 | 14.41 |
|  |  | 14.666 | 8.11 |
| 15.486 | 100.00 | 15.873 | 78.98 |
|  |  | 16.103 | 100.00 |
| 16.76 | 28.44 | 16.76 | 14.51 |
|  |  | 17.059 | 11.31 |
| 18.062 | 15.36 | 18.862 | 41.84 |
| 20.013 | 31.43 | 20.043 | 35.64 |
| 21.002 | 15.27 | 21.316 | 13.71 |
|  |  | 21.49 | 15.12 |
|  |  | 24.063 | 19.92 |
| 24.952 | 6.82 |  |  |
| 27.119 | 13.19 | 27.532 | 23.52 |
|  |  | 29.55 | 23.62 |
| 30.21 | 4.67 |  |  |
| 33.039 | 20.68 |  |  |
| 33.459 | 8.25 | 33.82 | 27.15 |
|  |  | 40.24 | 20.65 |
| 42.971 | 9.10 |  |  |
|  |  | 45.98 | 13.58 |

In solid state, both crystalline phases contain the dimer of $WCl_5$ (i.e., $W_2Cl_{10}$). Each tungsten atom is in a pseudo-octahedral geometry connected to four non-shared Cl atoms and two shared Cl atoms. As a result, the phase conversion from Phase 1 to Phase 2 is a diffusionless transformation. In other words, no major reorganization of the crystal structure is observed. In diffusionless transformations, the atoms change their positions slightly in a relatively coordinated manner without interruption of the original bonding (see, e.g., D. A. Porter et al., Phase transformations in metals and alloys, Chapman & Hall, 1992, p. 172). More particularly, phase conversion between Phase 1 and Phase 2 $WCl_5$ mainly involves a change of the β angle of the unit cells, with slight distortions on other unit cell parameters.

As shown in the examples that follow, different methods were used to prepare $WCl_5$ containing different percentages of Phase 1 and Phase 2. Powder X-Ray Diffraction (PXRD) measurements were performed on a Rigaku Miniflex diffractometer (Cu Kα radiation, λ=1.5406 Å). One of ordinary skill in the art will recognize that the PXRD measurements may also be determined using other anodes, including but not limited to Co, Mo, Cr, Ni, etc. The diffractometer was housed in a nitrogen filled glovebox so that the air-sensitive materials were handled without air/moisture exposure. Samples were received and transferred into the glovebox. Vials containing $WCl_5$ were then opened, and the materials ground into fine powders with an agate mortar and pestle. Standard sample holders were used. X-ray output was 450 W, and the detector was a scintillation counter. The powder patterns were collected using a θ-θ scan mode (range 2 θ=8°-50°, step size of 0.02°).

The Rietveld method and reference crystal structures of FIGS. 1 and 2 were used to determine the percentage of each crystalline phase in a variety of $WCl_5$ samples. More particularly, the background was determined and removed from each data set. The remaining diffraction peaks were matched to the reference patterns of FIGS. 1 and 2 to determine the phase composition percentage. To be specific, for the Phase 1/Phase 2 $WCl_5$ mixtures, diffraction peaks from the XRD data were matched to reference patterns for Phase 2 $WCl_5$ (PDF #04-005-4302) and $TaCl_5$ (PDF #04-019-4194, isostructural to the unreported Phase 1 $WCl_5$, substitute Ta with W atoms and adjust unit cell parameters to yield the crystal structure of Phase 1 $WCl_5$). The XRD data were then used to determine the relative phase fractions of the two crystalline phases in each sample. The final fits of the calculated diffraction intensities from the refined sample model to the raw XRD data was performed. The computer generated data closely matches the experimental data. Refined phase fractions may be obtained using software, such as MDI-Jade 2010.

Figure 3:
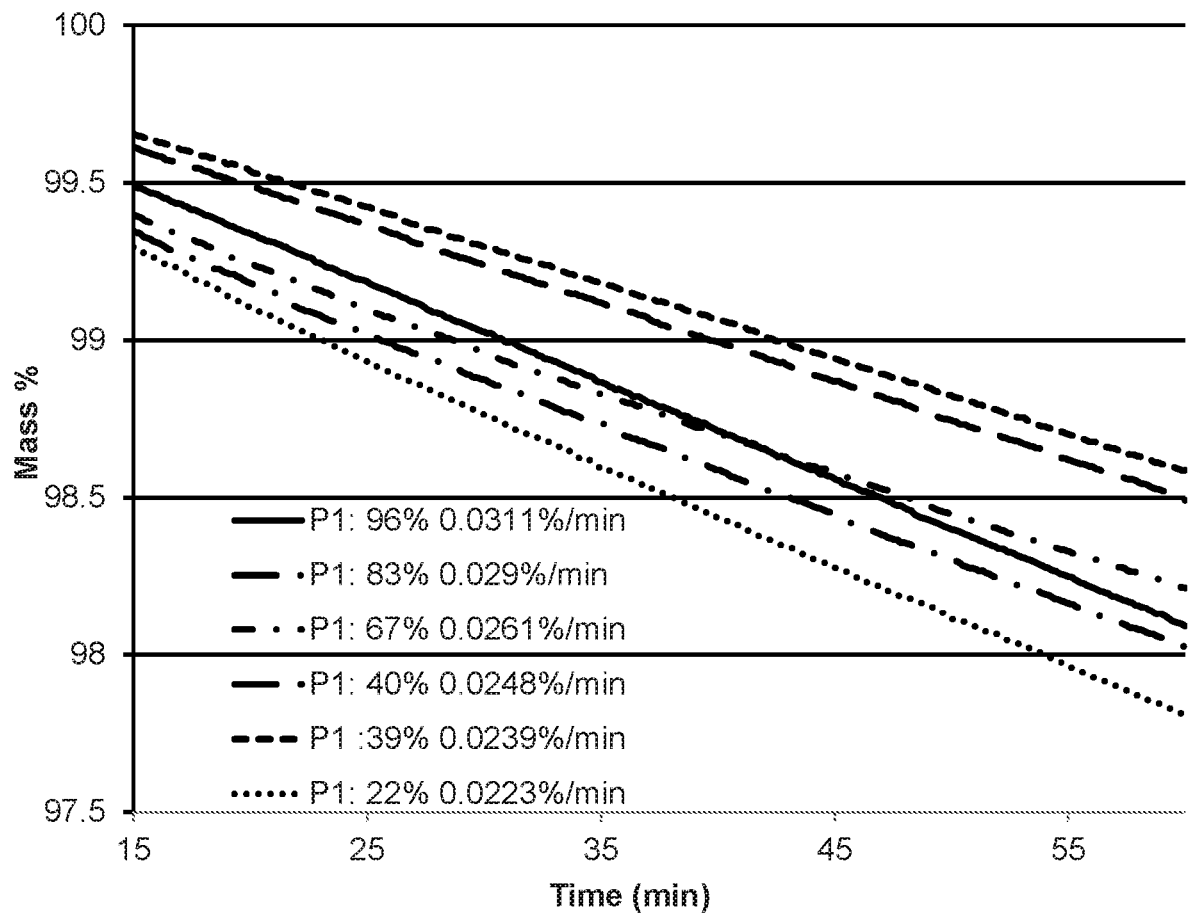
FIG. 3 is a graph showing the % mass loss at 120° C. versus time for different crystalline phase $WCl_5$ samples.

Applicants have discovered that the Phase 1 and Phase 2 crystalline phases of $WCl_5$ have different vapor pressures. FIG. 3 is a graph showing the showing the % mass loss over 60 minutes at 120° C. for different crystalline phase $WCl_5$ samples. In FIG. 3, the solid line ( —— ) shows the 0.0311% mass loss/minute for 96% Phase 1 $WCl_5$; the long dash-dot line ( —— · ) shows the 0.029% mass loss/minute for 83% Phase 1 $WCl_5$; the short dash-dot line ( —— · ) shows the 0.0261% mass loss/minute for 67% Phase 1 $WCl_5$; the long dash-long dash line ( —— —— ) shows the 0.0248% mass loss/minute for 40% Phase 1 $WCl_5$; the short dash-short dash line ( — — ) shows the 0.0239% mass loss/minute for 39% Phase 1 $WCl_5$; and the dotted line H shows the 0.0223% mass loss/minute for 22% Phase 1 $WCl_5$. The difference between the 0.0311% mass loss/minute for 96% Phase 1 $WCl_5$ versus the 0.0223% mass loss/minute for 22% Phase 1 $WCl_5$ demonstrates the impact that the phase change may have on the vapor supply and accompanying process rate.

Figure 4:
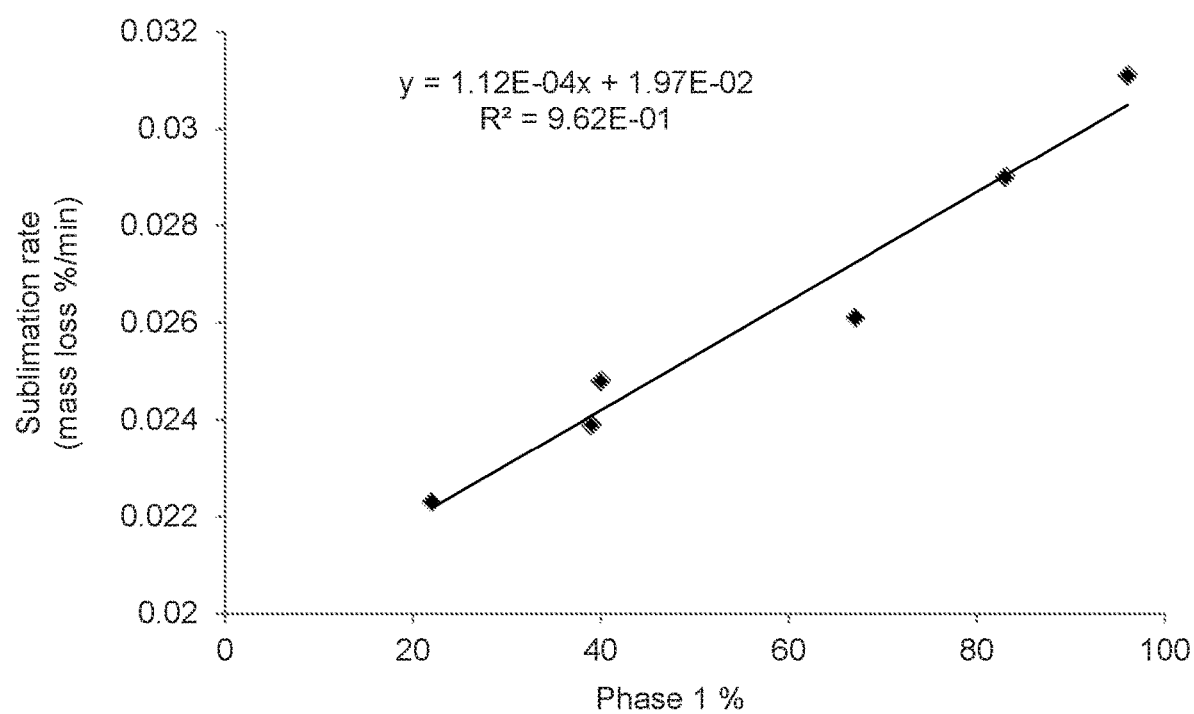
FIG. 4 is a graph of the sublimation rate in mass loss %/minute versus the percentage of Phase 1 $WCl_5$.

FIG. 4 is a graph of the sublimation rate in mass loss %/minute versus the percentage of Phase 1 $WCl_5$. As can be seen, the sublimation rate is linearly proportional to the percentage of crystalline phase material.

Figure 5:
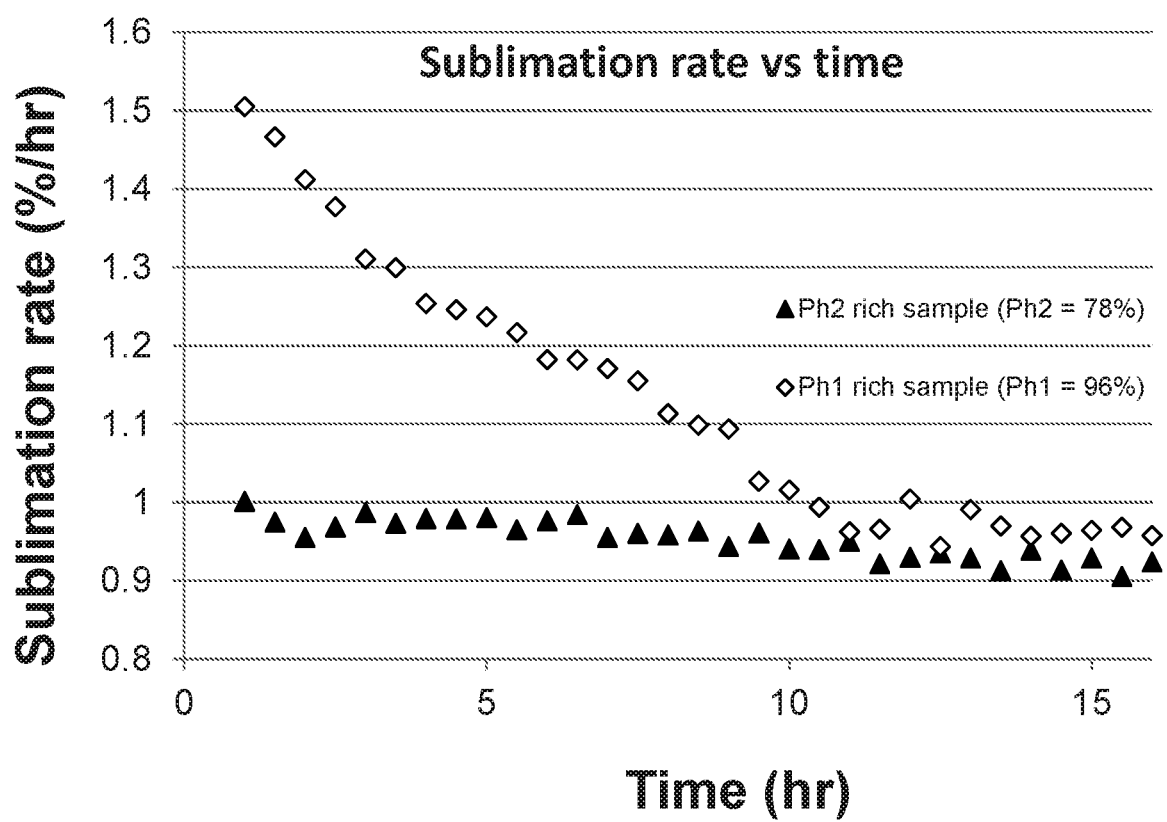
FIG. 5 is a graph showing the sublimation rate (Δ mass/Δ time) versus time for two different crystalline phase $WCl_5$ samples.

FIG. 5 is a graph showing the sublimation rate (Δ mass/Δ time) versus time for two different crystalline phase $WCl_5$ samples. The black triangles show that the sublimation rate for 22% Phase 1/78% Phase 2 $WCl_5$ is linear. This graph shows that the sublimation rate decreases only slightly during 16 hours of sublimation. In contract, the clear diamonds show that the sublimation rate for 96% Phase 1/4% Phase 2 $WCl_5$ almost immediately begins to rapidly decrease.

As can be seen from FIGS. 3-5, samples containing higher concentrations of Phase 2 have a lower sublimation rate in comparison to samples containing higher concentrations of Phase 1. Therefore, Phase 1 has a higher vapor pressure than Phase 2. Supplying $WCl_5$ that contains a mixture of Phase 1 and Phase 2 crystalline material will cause a vapor pressure drift over time because Phase 1 depletes faster than Phase 2 (i.e., Phase 1 has a higher vapor pressure), even in the absence of any phase conversion. Additionally, as shown in Example 3, Phase 1 converts to Phase 2 during the vapor deposition or etching processes. This conversion further exacerbates the vapor pressure drift.

The difference in vapor pressures and the conversion of the Phase 1 $WCl_5$ to Phase 2 $WCl_5$ during semiconductor processes results in shortened use of the $WCl_5$ materials and the necessity to adjust equipment parameters in order to be able to maintain a stable supply of $WCl_5$ vapors to the vapor deposition tool. Needless to say, adjusting parameters during semiconductor manufacturing is not desired.

To maintain a stable vapor pressure over time, the Phase 1:Phase 2 ratio should be maintained as close to the original phase ratio as possible. Additionally, Applicants have discovered that the Phase 2 material does not convert back to Phase 1 under storage at room temperature or after being heated to temperatures no greater than 247° C. As a result, vapors from Phase 2 $WCl_5$ may be supplied at a variety of temperatures without changing crystallinity phase. Therefore, even though the vapor pressure of Phase 2 is lower than that of Phase 1, a stable supply of the $WCl_5$ vapor may be supplied using higher concentrations of Phase 2 $WCl_5$. The stable supply of $WCl_5$ vapor is beneficial for semiconductor processes, such as vapor deposition or etching. Unfortunately, Applicants have not been able to create 100% Phase 2 $WCl_5$.

$WCl_5$ may be heated to a temperature just below its melting point in order to convert it from predominantly Phase 1 material to predominantly Phase 2 material (i.e., melting point=248° C.). The phase conversion occurs faster at the higher temperatures (i.e., faster at 240° C. than at 210° C.). Applicants have been able to produce $WCl_5$ compositions containing approximately 10% weight to approximately 40% weight of Phase 1 $WCl_5$ as determined by PXRD using a Cu anode, preferably containing approximately 10% weight to approximately 35% weight of Phase 1 $WCl_5$, and more preferably containing approximately 10% weight to approximately 25% weight of Phase 1 $WCl_5$.

Interestingly, $WCl_5$ maintains a higher percentage of Phase 1 material when it is melted and cooled (i.e., greater than 30%), as shown in Example 4. Similarly, as shown in Example 3, approximately 35% of Phase 1 material remains after consumption over 120 days at 120° C.

The phase conversion that typically occurs during the vapor deposition process (i.e., at temperatures of approximately 150° C.) occurs much slower than the phase conversion that occurs between 190° C. and 245° C. During the vapor deposition process, the vapors of $WCl_5$ are typically generated using a solid precursor vaporizer heated to a temperature of approximately 150° C. See, e.g., WO2017/075172 to L'Air Liquide, Societe Anyonyme pour l'Etude et l'Exploitation des Procedes Georges Claude. The solid precursor vaporizer is typically a stainless steel vessel, with at least an inlet and an outlet connected to isolation valves. Heating the solid precursor vaporizer to temperatures of 150° C. for an extended period of time in order to convert the material from Phase 1 to Phase 2 may result in corrosion and contamination of the $WCl_5$ by any stainless steel elements, such as Cr, Fe, Ni, etc.

One of ordinary skill in the art will recognize that the any lines connecting the solid precursor vaporizer to the deposition or etching chamber need to be heated in order to maintain the gas phase of the precursor. Failure to do so will result in precipitation of the solid precursor onto the lines. For cost, safety, and maintenance reasons, semiconductor manufacturers prefer to maintain the solid precursor vaporizer and any lines connecting the vaporizer to the processing chamber at lower temperatures (and preferably at room temperature). This, of course, further exacerbates the sublimation issues discussed above (i.e., depletion of the higher vapor pressure Phase 1 material and slow conversion of any remaining Phase 1 material to Phase 2).

Performing the phase conversion in a separate vessel at temperatures ranging from approximately 190° C. to 245° C. enables faster phase conversion than any conversion that occurs during the vapor delivery process. The vessel is chosen to withstand the both the material and its properties when heated. The vessel is also chosen to limit the risk of imparting any impurities into the $WCl_5$. Suitable vessels include glass vessels, quartz vessels, glass coated vessels, etc. After the $WCl_5$ is converted to a majority of Phase 2 material, it may be filled into a solid precursor vaporizer for use in the vapor deposition process.

EXAMPLES

The following non-limiting examples are provided to further illustrate embodiments of the invention. However, the examples are not intended to be all inclusive and are not intended to limit the scope of the inventions described herein.

Example 1: Vacuum Sublimation

Equipment: Glass sublimator set (Bottom part, cold finger, O-ring, clamp, chiller)

Crude $WCl_5$ was added to the bottom of the glass sublimator set. The sublimator was then placed into the heating mantle and properly assembled. The chiller was maintained at the coolant temperature at approximately 6° C. to approximately 25° C. The heating mantle was maintained at approximately 200° C. to approximately 220° C. After heating, the heating mantle is turned off and allowed to cool. The sublimator set was carefully disassembled and the materials condensed on the cold finger are then collected. Samples are submitted for XRD analysis to quantify crystalline phases.

This process is similar to that disclosed in WO2017/130745 to JX Nippon Mining & Metals Corp, in which the sublimate is recovered by air cooling or water cooling. Applicants believe that Phase 1 $WCl_5$ forms on the cool surface of the cold finger or other chilled surface.

TABLE 2

| Batch | Ph1 (%) | Ph2 (%) |
|---|---|---|
| Batch 1 | 97 | 3 |
| Batch 2 | 98 | 2 |

TABLE 2-continued

| Batch | Ph1 (%) | Ph2 (%) |
|---|---|---|
| Batch 3 | 96 | 4 |
| Batch 4 | 97 | 3 |
| Batch 5 | 95 | 5 |
| Batch 6 | 92 | 8 |

Example 2: Carrier Gas Assisted Sublimation

Crude $WCl_5$ was loaded to the coated stainless steel bottom kettle of a sublimation system. A lid was secured to the kettle with a clamp. A heating mantle was placed on the lid. One KF 45 joint of stainless steel tubing was connected to the lid with a KF 45 Kalrez gasket and secured with a clamp. A separate KF 45 joint of stainless steel tubing was connected to the inlet port of the lid. A vacuum line was connected to the outlet port of the lid. A $N_2$ carrier gas line was connected to the sublimator's purging port.

After a leak test of the system, the temperature controllers were set to:
Bottom: 210+/−10° C.
Lid: 220+/−10° C.
Transfer tubing: 230+/−10° C.
Receiving pot lid: 240+/−10° C.
$N_2$ flow: 100+/−10° C.

The flow meter for $N_2$ was set to 0.200 L/min.

After heating, the heating mantles were turned off. The sublimator was cooled below 80° C. and then flow of the carrier gas $N_2$ was stopped. The receiving pot is carefully disassembled and solid materials collected. Samples are submitted for XRD analysis to quantify crystalline phases.

TABLE 3

| Batch | Ph1 (%) | Ph2 (%) |
|---|---|---|
| Batch 1 | 68 | 32 |
| Batch 2 | 56 | 44 |
| Batch 3 | 83 | 17 |
| Batch 4 | 57 | 43 |

As can be seen, this process produces less Phase 1 $WCl_5$ than the process of Example 1. Applicants believe that the cooling temperatures affect the crystallinity of the final $WCl_5$ product. In other words, Applicants believe that cooler temperatures produce more Phase 1 $WCl_5$. The condensing temperature of Example 2 is higher than that of Example 1 because no external cooling source was used. Therefore, the percentage of Phase 1 material is higher in Example 1 than Example 2.

Example 3: In Situ Phase Change

Freshly vacuum sublimed $WCl_5$ is added to a solid precursor delivery device and maintained at a temperature of approximately 120° C. As shown in Example 1, such freshly sublimed $WCl_5$ contains greater than 90% Phase 1 $WCl_5$. Table 4 demonstrates that the percentage of Phase 1 material decreases due to the vapor deposition or etching processing conditions. More particularly, after more than 50% of the material has been consumed during the vapor deposition or etching process, only 35-51% of Phase 1 $WCl_5$ remains. However, $WCl_5$ containing less than 35% Phase 1 $WCl_5$ has not been produced during the vapor deposition process. Applicants believe that standard sublimation conditions are not sufficient to produce high quantities of Phase 2 $WCl_5$.

TABLE 4

| Batch | Initial Weight (g) | Final Weight (g) | % (w/w) Consumed | % Phase 1 Remaining | % Phase 2 Remaining |
|---|---|---|---|---|---|
| 1 | 402 | 109 | 73 | 35 | 65 |
| 2 | 404 | 146 | 64 | 40 | 60 |
| 3 | 400 | 168 | 58 | 49 | 51 |
| 4 | 400 | 171 | 57 | 51 | 49 |

Example 4: Melting

In a glovebox, 15 grams of freshly sublimed $WCl_5$ produced by the method of Example 2 (with 71% P1 and 29% P2) was added to a 100 mL heavy wall glass pressure vessel. The pressure vessel was sealed and removed from the glovebox. The bottom of the pressure vessel was submerged in a pre-heated sand bath at 260° C. in order to heat $WCl_5$ above its melting point (i.e., 248° C.). Once the solid $WCl_5$ completely melted, the material was heated for another 5 minutes, followed by cooling under different conditions. The pressure vessel was brought back into the glovebox. The $WCl_5$ product was collected and submitted for XRD analysis to quantify crystalline phases.

TABLE 5

| Sample | Condition | Ph1 (%) | Ph2 (%) |
|---|---|---|---|
| W-FG1717 | Starting Materials | 71 | 29 |
| 18-001-D | Rapid cooling (remove from heat bath to allow rapid cooling to RT) | 38 | 62 |
| 18-003-A | Slow cooling to 190 C. for 1 hr (leave in 190 C. bath for 1 hr to allow slow cooling, then remove to allow rapid cooling to RT) | 32 | 68 |

As can be seen, melting and cooling, whether quickly or more slowly, produces Phase 1=30-40%; Phase 2=70-60%.

Example 5: Small Scale Conditioning

In a glovebox, 15 grams of freshly sublimed $WCl_5$ solids produced by the method of Example 2 (with 71% P1 and 29% P2) was added to a 100 mL heavy wall glass pressure vessel. The pressure vessel was sealed and removed from the glovebox. The bottom of the pressure vessel was submerged in a pre-heated sand bath at 190° C. or 220° C. for a period of time. The pressure vessel was then removed from the sand bath and allowed to cool to room temperature for a period of 30 minutes. A big shiny cake was observed and it could be easily broken into shining crystalline powders by shaking the pressure vessel. The pressure vessel was brought back into the glovebox. Product was collected and submitted for XRD analysis to quantify crystalline phases.

TABLE 6

| Sample | Temp. (° C.) | Time (hr) | Ph1 (%) | Ph2 (%) |
|---|---|---|---|---|
| W-FG1717 (Starting Materials) | | | 71 | 29 |
| 18-001-A | 190 | 1 | 49 | 51 |
| 18-003-C | | 3 | 37 | 63 |
| 18-003-B | 220 | 3 | 22 | 78 |
| 18-004-A | | 6 | 16 | 84 |

The samples having 16% and 22% Phase 1 $WCl_5$ would be suitable to provide a stable vapor supply of $WCl_5$ vapor during vapor deposition or etching processes.

Example 6: Large Scale Conditioning

Figure 6:
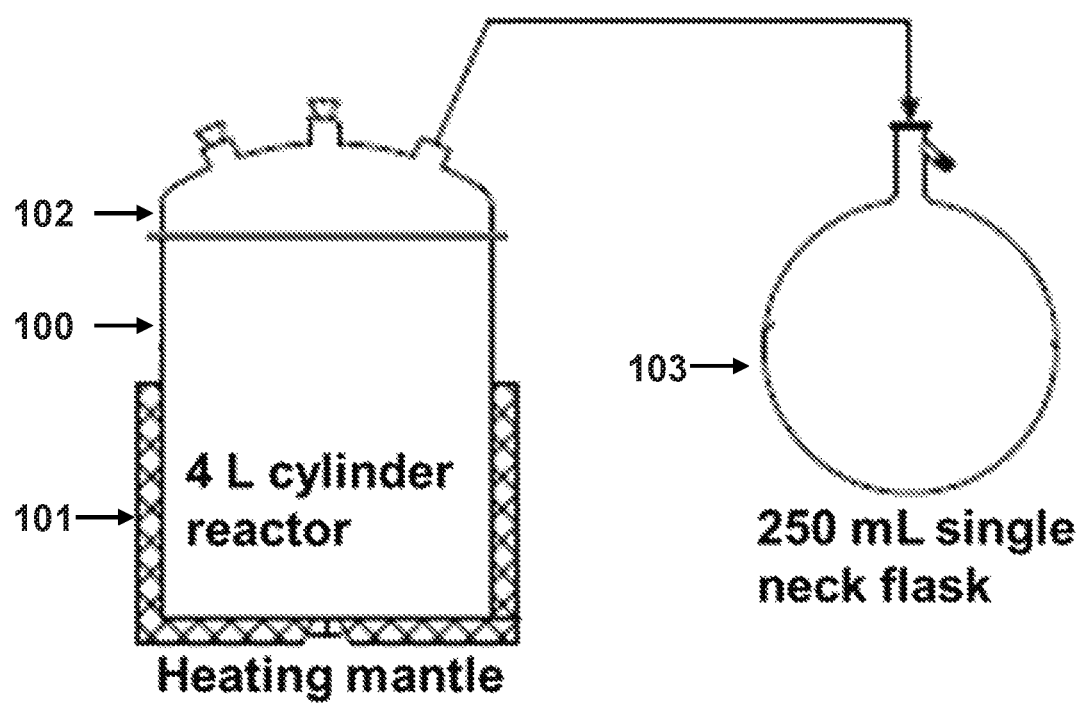
FIG. 6 is a schematic diagram of exemplary equipment in which Example 6 was performed.

FIG. 6 is a schematic diagram of the exemplary equipment in which this example was performed. One of ordinary skill in the art will recognize that the diagram is not to scale (i.e., the 250 mL flask is NOT the same size as the 4 L cylinder reactor). One of ordinary skill in the art will further recognize the sources for the equipment. Some level of customization of the components may be required based upon the desired temperature range, pressure range, local regulations, etc.

In a glovebox, 550 g (+/−50 g) grams of freshly sublimed $WCl_5$ produced by the method of Example 2 (with 17-44% weight Phase 2) was added to a 4 L heavy wall glass cylinder reactor 100. The lid 102 was secured to the reactor 100. A security flask 103 was connected to the lid 102 for safety purposes. More particularly, the security flask 103 captures any $WCl_5$ that may escape the reactor 100 due to overheating or other safety issues. The reactor 100 was heated at 230° C. for a period of 44 (+/−4) his using heating mantle 101. The temperature controller (not shown) was turned off and the reactor 100 was allowed to slowly cool to below 100° C. inside the heating mantle 101. The reactor 100 was then removed from the heating mantle 101. The lid 102 is disassembled and the big shiny black cake on the bottom of the reactor 100 was poured into the glass mortar. Crystalline powders were obtained by roughly grinding with glass mortar and pestle. Product was collected and submitted for XRD analysis to quantify crystalline phases. Table 7 demonstrates that this process repeatedly yields product having approximately 70% weight of Phase 2 material.

TABLE 7

| Batch | Phase 1 (weight %) | Phase 2 (weight %) |
|---|---|---|
| 1 | 28 | 72 |
| 2 | 28 | 72 |
| 3 | 29 | 71 |
| 4 | 28 | 72 |
| 5 | 30 | 70 |
| 6 | 31 | 69 |
| 7 | 31 | 69 |
| 8 | 30 | 70 |

These materials would be suitable to provide a stable vapor supply of $WCl_5$ vapor during a vapor deposition or etching processes.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

We claim:

1. A $WCl_5$-containing composition having 10% weight of $WCl_5$ to 40% weight of $WCl_5$ in the form of Phase 1 crystal structure $WCl_5$ as determined by X-ray diffraction.

2. The $WCl_5$-containing composition of claim 1, the composition having 10% weight to 35% weight of Phase 1 $WCl_5$.

3. The $WCl_5$-containing composition of claim 1, the composition having 10% weight to 30% weight of Phase 1 $WCl_5$.

4. The $WCl_5$-containing composition of claim 1, the composition having 10% weight to 25% weight of Phase 1 $WCl_5$.

\* \* \* \* \*